(12) United States Patent
Dhamdhere et al.

(10) Patent No.: US 9,755,638 B2
(45) Date of Patent: Sep. 5, 2017

(54) OUTPUT DISCHARGE TECHNIQUES FOR LOAD SWITCHES

(71) Applicant: Texas Instruments Incorporated, Dallas, TX (US)

(72) Inventors: Vikrant Dhamdhere, Irvine, CA (US); Kyle Schulmeyer, Plano, TX (US); Md. Abidur Rahman, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/938,702

(22) Filed: Nov. 11, 2015

(65) Prior Publication Data

US 2016/0134283 A1 May 12, 2016

Related U.S. Application Data

(60) Provisional application No. 62/078,593, filed on Nov. 12, 2014.

(51) Int. Cl.
*H03K 3/00* (2006.01)
*H03K 17/687* (2006.01)
*H02M 1/32* (2007.01)

(52) U.S. Cl.
CPC .... *H03K 17/687* (2013.01); *H01L 2924/0002* (2013.01); *H02M 2001/322* (2013.01)

(58) Field of Classification Search
CPC ... H03K 17/687; H01L 23/50; H01L 27/0629; H01L 23/5286; H02M 2001/322
See application file for complete search history.

(56) References Cited

U.S. PATENT DOCUMENTS 5,111,084 A * 5/1992 Suko .................. H03K 17/6872
326/88
7,683,678 B2 * 3/2010 Iwagami ............... H02M 7/538
315/224

(Continued)

FOREIGN PATENT DOCUMENTS

| CN | 102260785 A | 11/2011 |
|---|---|---|
| FR | 2397742 A1 | 9/1979 |
| JP | 2014092712 A | 9/2014 |

OTHER PUBLICATIONS

International Search Report and Written Opinion, PCT/US 2015/060469, dated Mar. 17, 2016, 7 pages.

*Primary Examiner* — Kenneth B Wells
(74) *Attorney, Agent, or Firm* — Gregory J. Albin; Charles A. Brill; Frank D. Cimino

(57) ABSTRACT

An output discharge circuit for a load switch may include a capacitor coupled between a power rail of the output discharge circuit and a ground lead, and a diode coupled between a power input of the output discharge circuit and the power rail. The output discharge circuit may charge the capacitor via a current path formed by the diode while power is being supplied to the load switch. When the power supply to the output discharge circuit is turned off, the diode may prevent the capacitor from discharging through the current path, and the stored charge on the capacitor may be used to power the output discharge switch for a period of time after the power supply has been turned off. In this way, the output discharge circuit may continue to discharge the output of the load switch even when power is no longer being supplied to the load switch.

19 Claims, 2 Drawing Sheets

(56) References Cited

U.S. PATENT DOCUMENTS

| | | | |
|---|---|---|---|
| 8,476,939 B1* | 7/2013 | Candage | H03K 17/122 327/102 |
| 8,618,846 B2* | 12/2013 | Lee | H03K 17/166 327/108 |
| 2009/0315595 A1* | 12/2009 | Nakagawa | H03K 17/063 327/109 |
| 2014/0285241 A1* | 9/2014 | Umetani | H03K 17/162 327/109 |

* cited by examiner

OUTPUT DISCHARGE TECHNIQUES FOR LOAD SWITCHES

This application claims the benefit of U.S. Provisional Application No. 62/078,593, filed Nov. 12, 2014, the entire content of which is incorporated herein by reference.

TECHNICAL FIELD

The disclosure relates to electrical circuits, and more particularly, to load switches.

BACKGROUND

Load switches may be used in a variety of electronic devices including, for example, personal electronics (e.g., solid state drives and tablets), electronic point of sale devices (e.g., bar code scanners and payment terminals), industrial personal computers, home appliances, and servers. Load switches may be used for power distribution, power sequencing, reducing leakage current, controlling inrush current, and controlling power downs.

Load switches may act as electronic relays that turn on and off power rails that are used to power downstream components in electronic devices. When a load switch is turned off, charge may continue to reside on the output of the load switch, which may disturb the downstream electronic components. Dealing with the residual charge on the output of the load switch may present significant design challenges, particularly in cases where power supply to the load switch is turned off.

SUMMARY

According to this disclosure, an integrated circuit includes an input voltage lead, an output voltage lead, a pass transistor coupled between the input voltage lead and the output voltage lead, and an output discharge circuit. The output discharge circuit includes a power input, and a control input. The output discharge circuit further includes a first transistor coupled between the output voltage lead and a ground lead. The first transistor has a control electrode. The output discharge circuit further includes a diode having an anode coupled to the power input. The output discharge circuit further includes a capacitor coupled between a cathode of the diode and the ground lead. The output discharge circuit further includes a resistor coupled between the cathode of the diode and the control electrode of the first transistor. The output discharge circuit further includes a second transistor coupled between the control electrode of the first transistor and the ground lead. The second transistor has a control electrode coupled to the control input of the output discharge circuit.

According to this disclosure, an integrated circuit includes an input voltage lead, an output voltage lead, a pass transistor coupled between the input voltage lead and the output voltage lead, and an output discharge circuit coupled between the output voltage lead and a ground lead. The output discharge circuit includes a power input, and a diode having an anode coupled to the power input. The output discharge circuit further includes a capacitor coupled between a cathode of the diode and the ground lead.

According to additional aspects of this disclosure, a method includes charging, via a current path, a capacitor coupled between a power rail of a buffer and a ground lead in response to a voltage being applied to a power input of an output discharge circuit of a switch. The method further includes preventing the capacitor from discharging through the current path in response to the voltage ceasing to be applied to the power input of the output discharge circuit. The method further includes supplying power to the output discharge circuit based on the charge stored in the charged capacitor in response to the voltage ceasing to be applied to the power input of the output discharge circuit.

DETAILED DESCRIPTION

Figure 1:
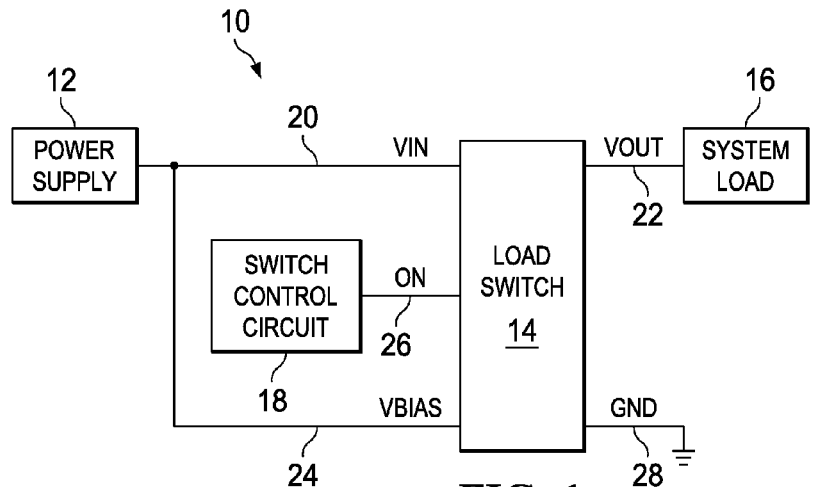
FIG. 1 is a block diagram showing an example system that includes a load switch according to this disclosure.

This disclosure describes output discharge techniques for discharging the output of a load switch. Load switches may use an output discharge circuit to discharge the output of the load switch when the switch is turned off. The output discharge circuit may be a powered circuit that is powered by one or more power supplies coupled to the load switch. Turning off the power supply to the load switch while or soon after the load switch turns off may interfere with the operation of the output discharge circuit, thereby preventing the output of the switch from being discharged.

According to this disclosure, an output discharge circuit for a load switch may include a capacitor coupled between a power rail of the output discharge circuit and a ground lead, and a diode coupled between a power input of the output discharge circuit and the power rail. The output discharge circuit may charge the capacitor via a current path formed by the diode while power is being supplied to the load switch. When the power supply to the output discharge circuit is turned off, the diode may prevent the capacitor from discharging through the current path, and the stored charge on the capacitor may be used to power the output discharge switch for a period of time after the power supply has been turned off. In this way, the output discharge circuit may continue to discharge the output of the load switch even when power is no longer being supplied to the load switch.

In some examples, the output discharge circuit may include a discharge switch that is coupled between the output of the load switch and a ground rail. The output discharge circuit may further include buffer (e.g., an inverter) that is coupled to a control input of the discharge switch. The buffer may control the discharge switch based on an input control signal, and may be powered by a power supply input. A high logic voltage may be needed to close the discharge switch in order to discharge the load switch. For example, the discharge switch may be an n-type metal-oxide-semiconductor (NMOS) transistor, and a voltage greater than the turn-on threshold voltage of the NMOS transistor may be needed to turn on the transistor. If the buffer does not receive sufficient power, the buffer may not be able to produce a voltage sufficient to turn on the NMOS transistor, which may prevent the output of the load switch form discharging.

According to this disclosure, a capacitor may be coupled between a power rail of the buffer and a ground rail, and a diode may be coupled between a power input of the output discharge circuit and the power rail of the buffer. The capacitor and diode may allow the buffer to supply a high logic voltage for a time period after power has been removed from the power input of the output discharge circuit. In this way, a buffer-based (or inverter-based) output discharge circuit may be able to continue to discharge the output of a load switch even without an active power supply.

A buffer-based (e.g., inverter-based) output discharge circuit may allow an active-low output discharge control signal to be used to control an active-high discharge switch. An active-low output discharge control signal may refer to a control signal that causes the discharge switch to close and discharge the load switch output when the voltage is below a threshold, and to open when the voltage is above the threshold. An active-high discharge switch may be a switch that closes when the voltage is above a threshold and opens when the voltage is below a threshold.

In some examples, the buffer may be an inverter, for example, an NMOS inverter with a resistive load or an active load. An NMOS inverter may be able to level shift the input voltage to a higher voltage.

A buffer-based output discharge circuit that uses an active-low output discharge control signal may also allow the output discharge circuit to be controlled (at least partially) by the pass transistor gate voltage of the load switch. Using the gate voltage of the pass transistor as a control signal may allow the activation of the output discharge circuit to be deferred until the gate of the pass transistor has reached a low voltage that is sufficient to ensure that the pass transistor is turned off, thereby preventing excessive current in-rush that would otherwise occur if the pass transistor were turned on.

When the pass transistor of a load switch is turned on, the gate voltage of the pass transistor may be high enough to damage other components in the output discharge circuit and/or associated control circuitry. In examples where the gate voltage is used to defer the turning on of the output discharge switch, a gate voltage coupling circuit may be used to decouple the gate voltage of the pass transistor from the control input of the output discharge circuit when the gate voltage is above a threshold voltage, and to couple the gate voltage to the control input when the gate voltage is below a threshold voltage. In this way, the gate voltage may be used to control when the output discharge circuit turns on, while avoiding damage that may be caused by excessively high gate voltages being directly applied to the control input of the output discharge switch.

In some examples, the gate voltage coupling circuit may include a transistor coupled between the gate voltage of the pass transistor and the control input of the output discharge circuit. In such examples, the control electrode of the transistor may be coupled to a reference voltage, which may define or control a threshold voltage for the gate voltage coupling circuit. When the pass transistor gate voltage is below the threshold voltage, the gate voltage coupling circuit transistor may output the pass transistor gate voltage to the control input of the output discharge circuit. On the other hand, when the pass transistor gate voltage is above the threshold voltage, the gate voltage coupling circuit transistor may output the threshold voltage to the control input of the output discharge circuit. In this way, the output of the gate voltage coupling circuit may be limited to a relatively low voltage that does not damage other control circuitry in the load switch.

The reference voltage for the gate voltage coupling circuit transistor may be supplied by a power supply. However, if the power supply is turned off, then the gate voltage coupling circuit transistor may output a low voltage that causes the output discharge circuit to activate, even if the gate voltage of the pass transistor is still high enough to turn on the pass transistor. Activating the output discharge circuit while the pass transistor is still turned on may cause undesirable levels of inrush current.

According to this disclosure, a capacitor may be coupled between a control electrode of the gate voltage coupling circuit transistor and a ground rail, and a diode may be coupled between a reference voltage input and the control electrode of the gate voltage coupling circuit transistor. The capacitor and diode may allow the gate voltage coupling circuit transistor to continue to operate even after power has ceased to be supplied to the reference voltage input. In this way, the activation of an output discharge circuit may be delayed until after the pass transistor of the load switch turns off even when power is no longer being supplied to the gate voltage coupling circuit.

In some examples, control circuitry for the output discharge circuit may also include a pass transistor gate discharge circuit that forms a discharge path for the gate voltage of the pass transistor when the pass transistor is turned off. Such a circuit may include a transistor that is coupled between the control input of the output discharge circuit and a ground rail. This transistor may form a pass transistor discharge path in conjunction with the gate voltage coupling circuit.

The pass transistor gate discharge circuit may further include a buffer (e.g., an inverter) with an output that is coupled to a control electrode of the transistor. The buffer may be controlled by an enable input of the load switch, and may be powered by a power supply received from the power input. If the power supply is turned off, then the buffer may output a low logic voltage, which may prevent the gate discharge circuit from forming a discharge path for the pass transistor, thereby preventing the pass transistor from turning off when the load switch is disabled.

According to this disclosure, a capacitor may be coupled between a power rail of the buffer and a ground rail, and a diode may be coupled between a power input of the load switch and the power rail of the buffer. The capacitor and diode may allow the buffer to continue to supply a high logic voltage to the gate discharge circuit transistor even after power has ceased to be supplied to the load switch. In this way, the gate of the pass transistor may continue to be discharged even when power is no longer being supplied to the load switch.

In additional examples, instead of a single diode being used to connect a power supply to a power rail or to a control electrode, multiple diodes may be used to connect multiple different power supplies to the power rails or control electrodes. In this way, if one power supply were to be turned off, another of the power supplies may continue to supply power to the control circuitry, thereby providing an output discharge circuit that is more robust to losses of power in a single power supply.

FIG. 1 is a block diagram showing an example system 10 that includes a load switch according to this disclosure. System 10 includes a power supply 12, a load switch 14, a system load 16, a switch control circuit 18 and leads 20, 22, 24, 26, 28.

A power output of system 10 is coupled to a voltage input (VIN) of load switch 14 via lead 20 and to a bias voltage input (VBIAS) of load switch 14 via lead 24. An output of switch control circuit 18 is connected to an enable input (ON) of load switch 14 via lead 26. A voltage output (VOUT) of load switch 14 is coupled to system load 16 via lead 22. A ground input (GND) of load switch 14 is coupled to a ground terminal via lead 28.

In some examples, system load 16 may include one or more powered electronic components. In one example, the powered electronic components may be one or more solid-state drive components. In further examples, system load 16 may include one or more capacitors.

During operation, power supply 12 supplies power to the voltage input and the bias voltage input via lead 24. Switch control circuit 18 enables and disables load switch 14 (e.g., turns load switch 14 on and off) by sending one or more control signals to the enable input of load switch 14 via lead 26. When load switch 14 is turned on, load switch 14 may turn on a pass transistor coupled between the voltage input (VIN) and output (VOUT) of load switch 14 such that a current path is formed between the voltage input (VIN) and output (VOUT). The current path formed by load switch 14 may allow power (e.g., voltage and/or current) to pass through load switch 14 to one or more power rails included in system load 16, thereby charging lead 22 and one or more power rails included in system load 16. When load switch 14 is turned off, load switch 14 may turn off the pass transistor such that an open circuit is formed between the voltage input (VIN) and output (VOUT) of load switch 14. The open circuit formed by load switch 14 may prevent power from being transferred through load switch 14 to one or more power rails included in system load 16.

To turn off load switch 14, switch control circuit 18 may transition a control signal carried by lead 26 from a first logic state to a second logic state (e.g., transition the control signal from a high logic state to a low logic state). In response to the transition, load switch 14 may turn off the pass transistor coupled between VIN and VOUT. However, some residual charge may still remain on lead 22 and the power rails included in system load 16.

Load switch 14 may include an output discharge circuit that is configured to discharge the output (VOUT) of load switch 14 when load switch 14 is turned off. The output discharge circuit may be a powered circuit that is powered by one or more power sources. In the example system 10 of FIG. 1, the output discharge switch is powered by power supply 12. For example, a power input of the output discharge switch may be coupled to one or both of the voltage input (VIN) or the bias voltage input (VBIAS) of load switch 14. Turning off power supply 12 during or soon after load switch 14 turns off may interfere with the operation of the output discharge circuit, thereby preventing the output of load switch 14 from being discharged.

According to this disclosure, load switch 14 may include a capacitor coupled between a power rail of the output discharge circuit and a ground lead, and a diode coupled between a power input of the output discharge circuit and the power rail. The output discharge circuit may charge the capacitor via a current path formed by the diode when power supply 12 is supplying power to load switch 14. When power supply 12 ceases to supply power to load switch 14, the diode may prevent the capacitor from discharging through the current path formed by the diode, and the stored charge on the capacitor may be used to power the output discharge switch for a period of time after load switch 14 ceases to supply power. In this way, load switch 14 may continue to discharge the output (VOUT) of load switch 14 even when power is no longer being supplied to load switch 14.

In some examples, the output discharge circuit in load switch 14 may be controlled at least partially based on the gate voltage of the pass transistor included in load switch 14. This may allow the activation of output discharge circuit to be delayed until after the pass transistor is turned off. When coupling the gate voltage to the control circuitry for the output discharge circuit, a gate voltage coupling circuit may be used to prevent high voltages on the gate of the pass transistor from damaging the control circuit. The gate voltage coupling circuit may operate based on a reference voltage that is supplied by power supply 12 via one or both of the voltage input (VIN) and the bias voltage input (VBIAS) of load switch 14. However, if the power supply 12 is turned off, then the gate voltage coupling circuit may cause the output discharge circuit to activate, even if the pass transistor is still turned on, which may in turn cause undesirable levels of inrush current to occur.

According this disclosure, a capacitor may be coupled between a control electrode of the gate voltage coupling circuit and a ground rail, and a diode may be coupled between a reference voltage input and the control electrode of the gate voltage coupling circuit. The capacitor and diode may allow the gate voltage coupling circuit to continue to operate even after power has ceased to be supplied to the reference voltage input of the gate voltage coupling circuit. In this way, the activation of an output discharge circuit may be delayed until after the pass transistor of load switch 14 turns off even when power is no longer being supplied to load switch 14.

In additional examples, the control circuitry for the output discharge circuit of load switch 14 may also include a pass transistor gate discharge circuit that forms a discharge path for the gate voltage of the pass transistor when the pass transistor is turned off. Such a circuit may include a buffer (e.g., inverter) that is controlled by an enable input (ON) of load switch 14 and that is powered by power supply 12 via one or both of the voltage input (VIN) and the bias voltage input (VBIAS) of load switch 14. If power supply 12 is turned off, then the buffer may output a low voltage, which may prevent the gate discharge circuit from forming a discharge path for the pass transistor, which may prevent the pass transistor from turning off when the load switch is disabled.

According to this disclosure, a capacitor may be coupled between a power rail of the buffer and a ground rail, and a diode may be coupled between a power input of the load switch and the power rail of the buffer. The capacitor and diode may allow the buffer to continue to supply a high voltage to the gate discharge circuit transistor even after power has ceased to be supplied to the load switch. In this way, the gate of the pass transistor may continue to be discharged even when power is no longer being supplied to load switch 14.

Figure 2:
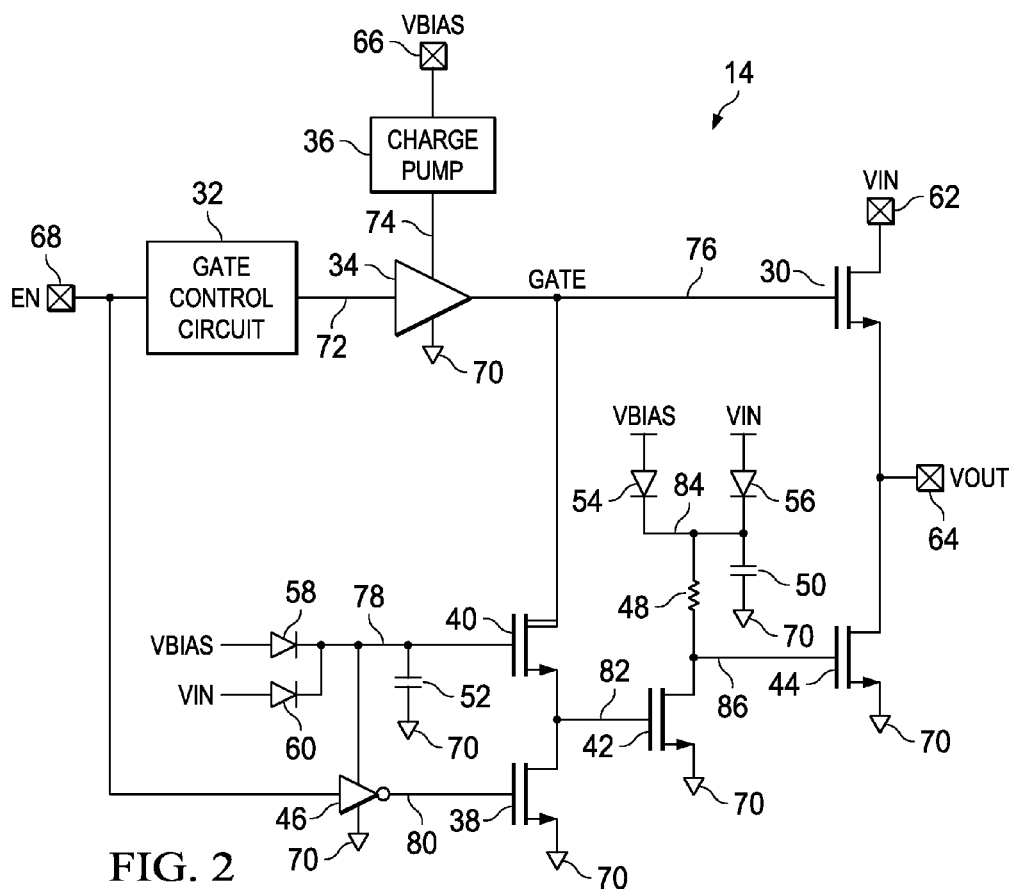
FIG. 2 is a schematic showing additional details of an example load switch according to this disclosure.

FIG. 2 is a schematic showing additional details of an example load switch 14 according to this disclosure. Load switch 14 includes a pass transistor 30, a gate control circuit 32, a gate driver 34, a charge pump 36, transistors 38, 40, 42, 44, an inverter 46, a resistor 48, capacitors 50, 52, diodes 54, 56, 58, 60, an input voltage lead 62, an output voltage lead 64, a bias voltage lead 66, a switch enable lead 68, a ground lead 70 and conductors 72, 74, 76, 78, 80, 82, 84, 86. Conductors 72, 74, 76, 78, 80, 82, 84, 86 may form respective circuit nodes in load switch 14.

In some examples, all or a portion of load switch 14 may be formed on one or more integrated circuits. In such examples, one or more of input voltage lead 62, output voltage lead 64, bias voltage lead 66, switch enable lead 68, and ground lead 70 may, in some examples, be coupled to respective input or output pins of the integrated circuit.

A drain electrode of pass transistor 30 is coupled to input voltage lead 62. A source electrode of pass transistor 30 is coupled to output voltage lead 64. A control input of gate control circuit 32 is coupled to switch enable lead 68. An output of gate control circuit 32 is coupled to an input gate driver 34 via conductor 72. An output of gate driver 34 is coupled to a gate electrode of pass transistor 30 via conductor 76. A reference voltage input of charge pump 36 is coupled to bias voltage lead 66. An output of charge pump 36 is coupled to a first power input of gate driver 34 via conductor 74. A second power input of gate driver 34 is coupled to ground lead 70.

A drain electrode of transistor 44 is coupled to a source electrode of pass transistor 30 and to output voltage lead 64. A source electrode of transistor 44 is coupled to ground lead 70. A drain electrode of transistor 42 is coupled to a gate electrode of transistor 44 via conductor 86. A source electrode of transistor 42 is coupled to ground lead 70.

An anode of diode 54 is coupled to bias voltage lead 66. An anode of diode 56 is coupled to input voltage lead 62. The cathodes of diodes 54, 56 are coupled to each other and to first terminals of resistor 48 and capacitor 50 via conductor 84. A second terminal of capacitor 50 is coupled to ground lead 70. A second terminal of resistor 48 is coupled to the drain electrode of transistor 42.

A drain electrode of transistor 40 is coupled to a gate electrode of pass transistor 30 via conductor 76. A source electrode of transistor 40 is coupled to the gate electrode of transistor 42 via conductor 82.

An anode of diode 58 is coupled to bias voltage lead 66. An anode of diode 60 is coupled to input voltage lead 62. The cathodes of diodes 58, 60 are coupled to each other, to a first terminal of capacitor 52, to a gate electrode of transistor 40, and to a power input of inverter 46 via conductor 78. A second terminal of capacitor 52 is coupled to ground lead 70.

A drain electrode of transistor 38 is coupled to the source electrode of transistor 40 and to the gate electrode of transistor 42 via conductor 82. A source electrode of transistor 38 is coupled to ground lead 70.

An input of inverter 46 is coupled to switch enable lead 68. An output of inverter 46 is coupled to the gate electrode of transistor 38 via conductor 80. A power input of inverter 46 is coupled to the cathodes of diodes 58, 60 and to the first terminal of capacitor 52 via conductor 78.

As shown in FIG. 2, each of transistors 30, 38, 40, 42, 44 are n-type metal-oxide-semiconductors. In some examples, pass transistor 30 and transistor 40 may be high voltage transistors and transistors 38, 42, 44 may be low voltage transistors. The high voltage transistors may have higher drain-to-source breakdown voltages than the low voltage transistors. In some examples, transistor 40 may be a drain extended n-type MOS (DENMOS) transistor.

Although the example load switch 14 of FIG. 2 is described with respect to NMOS transistors, in other examples, any combination of the same or different types of transistors may be used with the same or different conductivity types. Transistors 30, 38, 40, 42, 44 may be examples of switches and/or controlled current sources (e.g., voltage controlled current sources) where the gate electrodes correspond to the control electrodes, and the source and drain electrodes correspond to current conduction electrodes. In other examples, one or more of transistors 30, 38, 40, 42, 44 may be replaced with combinations of the same or different types of switches and/or controlled current sources (e.g., voltage or current-controlled current sources).

In some examples, one or both of capacitors 50, 52 may be relatively large capacitors and/or may be formed on the same integrated circuit as the other circuitry included in load switch 14. For example, capacitor 50 may be greater than or equal to 10 picofrarads (pF), and more particularly, greater than or equal to 15 pF, and more particularly, greater than or equal to 20 pF.

Gate control circuit 32 may control the operation of pass transistor 30 in response to an enable signal carried by switch enable lead 68. For example, gate control circuit 32 may produce one or more signals on conductor 72 that cause gate driver 34 to either produce or not produce a voltage sufficient to turn on pass transistor 30. Gate driver 34 may provide a voltage that is sufficient to turn on pass transistor 30 in response to receiving an appropriate control signal via conductor 72.

Charge pump 36 may generate a voltage that is sufficient to turn on pass transistor 30 based on a voltage carried by bias voltage lead 66. Gate driver 34 may use the voltage generated by charge pump 36 to provide a voltage to the gate of pass transistor 30 that is sufficient to turn on pass transistor 30 (e.g., the voltage may be greater than the source voltage of pass transistor 30 added to the turn-on threshold voltage of pass transistor 30). In some examples, the voltage carried by bias voltage lead 66 may not be sufficient to turn on pass transistor 30 (e.g., the voltage may be less than the source voltage of pass transistor 30 added to the turn-on threshold voltage of pass transistor 30).

Transistor 44 may form an output discharge switch that is coupled between output voltage lead 64 and ground lead 70. When a high voltage signal is applied to the control electrode of transistor 44, the output discharge switch may close, thereby forming a current conduction path between output voltage lead 64 and ground lead 70. When a low voltage signal (e.g., zero volts) is applied to the control electrode of transistor 44, the output discharge switch may open, thereby disconnecting output voltage lead 64 from ground lead 70.

Transistor 42 and resistor 48 may form an NMOS inverter, or more generally an inverter, and even more generally a buffer (e.g., an inverting buffer). The gate electrode of transistor 42 may form an input of the buffer, and the drain electrode of transistor 42 may form an output of the buffer. Conductor 84 may form a power rail for the buffer.

When a low voltage signal is received at the control electrode of transistor 42, the buffer may output a high voltage signal. For example, transistor 42 may turn off, which may cause the output voltage (i.e., the voltage at the drain of transistor 42) to be substantially equal to the voltage carried by the power rail formed by conductor 84. The voltage carried by the power rail formed by conductor 84 may be approximately equal to one or both of the voltages carried by input voltage lead 62 and bias voltage lead 66, which may correspond to high logic voltage.

When a high voltage signal is received at the control electrode of transistor 42, the buffer may output a low voltage signal. For example, transistor 42 may turn on, which may form a voltage drop across resistor 48, thereby causing a low voltage to be carried by conductor 86. The low voltage may correspond to a low logic voltage.

The inverter formed by transistor 42 and resistor 48 and the output discharge switch formed by transistor 44 may together form an output discharge circuit that is coupled between output voltage lead 64 and ground lead 70. The output discharge circuit has an input formed by the control electrode of transistor 42.

Transistor 40 may form a gate voltage coupling circuit that is coupled between the gate of pass transistor 30 and the input of the output discharge circuit that is formed by the control electrode of transistor 42. The control electrode of transistor 40 may receive a reference voltage carried by conductor 78, which may be approximately equal to one or both of the voltages carried by input voltage lead 62 and bias voltage lead 66. The reference voltage may determine whether transistor 40 operates in a triode mode or in a saturation mode. When transistor 40 is operating in the triode mode, transistor 40 may output a voltage at the source electrode of transistor 40 that is approximately equal to the pass transistor gate voltage carried by conductor 76. When transistor 40 is operating in the saturation mode, transistor 40 may output a voltage that is less than the voltage present at the gate electrode of transistor 40, regardless of how large the pass transistor gate voltage is.

Transistor 38 may form a gate voltage discharge switch that is coupled between the input of the output discharge circuit (formed by transistors 42, 44 and resistor 48) and ground lead 70. When a high voltage signal is applied to the control electrode of transistor 38, the gate voltage discharge switch may close, thereby forming a current conduction path between the gate of pass transistor 30 and ground lead 70. Specifically, the current conduction path (or discharge path) may be formed through both of transistors 38 and 40. When a low voltage signal (e.g., zero volts) is applied to the control electrode of transistor 38, the gate voltage discharge switch may open, thereby disconnecting the gate of pass transistor 30 from ground lead 70.

The gate voltage discharge switch formed by transistor 38 may be controlled by the voltage carried by the output of inverter 46, which in turn may be controlled by the voltage carried by switch enable lead 68. In response to switch enable lead 68 carrying a low voltage, inverter 46 may output a high voltage, thereby turning on transistor 38 and forming a gate voltage discharge path. In response to switch enable lead 68 carrying a high voltage, inverter 46 may output a low voltage, thereby turning off transistor 38 and disconnecting the gate of pass transistor 30 from ground lead 70. Conductor 78 may form a power rail for inverter 46. The voltage carried by the power rail formed by conductor 78 may be approximately equal to one or both of the voltages carried by input voltage lead 62 and bias voltage lead 66.

Transistors 38, 40 and inverter 46 may form a control circuit that controls the output discharge circuit formed by transistors 42, 44 and resistor 48. The control circuit may control the output discharge circuit at least partially based on the gate voltage of pass transistor 30, and may also discharge the gate voltage of pass transistor 30 by forming a gate voltage discharge path in response to load switch 14 being disabled (i.e., in response to the voltage carried by switch enable lead transitioning to a low logic voltage).

Diodes 54, 56 may form current paths between bias voltage lead 66 and input voltage lead 62, respectively, and capacitor 50 when voltages are applied to one or both of bias voltage lead 66 and input voltage lead 62, thereby allowing capacitor 50 to be charged. Diodes 54, 56 may prevent capacitor 52 from being discharged through diodes 54, 56 when voltages are no longer applied to both of input voltage lead 62 and bias voltage lead 66.

Similarly, diodes 58, 60 may form current paths between bias voltage lead 66 and input voltage lead 62, respectively, and capacitor 52 when voltages are applied to one or both of bias voltage lead 66 and input voltage lead 62, thereby allowing capacitor 52 to be charged. Diodes 58, 60 may prevent capacitor 52 from being discharged through diodes 58, 60 when voltages are no longer applied to both of input voltage lead 62 and bias voltage lead 66.

The operation of load switch 14 will now be described for the case when load switch 14 is enabled and power is supplied to both input voltage lead 62 and bias voltage lead 66. To enable load switch 14, a switch control circuit (e.g., switch control circuit 18 in FIG. 1) asserts a high logic voltage on switch enable lead 68. In response to receiving the high logic voltage, gate control circuit 32 outputs a signal via conductor 72 that causes gate driver 34 to turn on pass transistor 30. Charge pump 36 generates a voltage based on the voltage carried by bias voltage lead 66 that is sufficient to turn on pass transistor 30, and outputs the voltage to the power input of gate driver 34. In response to receiving the signal from gate control circuit 32 via conductor 72, gate driver 34 generates a voltage that is sufficient to turn on pass transistor 30. Pass transistor 30 turns on, thereby forming a current conduction path between input voltage lead 62 and output voltage lead 64.

Inverter 46 is powered by one or both of input voltage lead 62 and bias voltage lead 66. In response to receiving the high logic voltage carried by switch enable lead 68, inverter 46 outputs a low logic voltage to the gate electrode of transistor 38, which turns transistor 38 off. Consequently, the gate electrode of pass transistor 30 is disconnected from ground lead 70 (i.e., no current path is formed between the gate electrode of pass transistor 30 and ground lead 70). The voltages supplied by input voltage lead 62 and bias voltage lead 66 may be less than the voltage at the gate electrode of pass transistor 30 when pass transistor 30 is turned on. Thus, transistor 40 may operate in saturation and charge conductor 82 until the voltage at conductor 82 reaches a voltage sufficient to cutoff transistor 40. Transistor 40 may charge conductor 82 to a voltage level that is approximately is equal to the voltage at the gate electrode of transistor 40 less the gate turn-on threshold voltage of transistor 40. This voltage may be sufficient to turn on transistor 42.

The inverter formed by transistor 42 and resistor 48 is powered by one or both of input voltage lead 62 and bias voltage lead 66. In response to the relatively high voltage provided by transistor 40, transistor 42 turns on and forms a current path between resistor 48 and ground lead 70. This causes a voltage drop to occur across resistor 48, and a low logic voltage to be produced at the gate electrode of transistor 44. In response to receiving the low logic voltage at the gate electrode, transistor 44 remains turned off, thereby preventing the formation of a discharge path from output voltage lead 64 to ground lead 70.

During normal operation, when load switch 14 is enabled, diodes 54, 56 may allow capacitor 50 to be charged to a voltage level approximately equal to one or both of input voltage lead 62 and bias voltage lead 66. Similarly, diodes 58, 60 may allow capacitor 52 to be charged to a voltage level approximately equal to one or both of input voltage lead 62 and bias voltage lead 66.

The operation of load switch 14 will now be described for the case when load switch 14 is disabled and power continues to be supplied to both input voltage lead 62 and bias voltage lead 66. To disable load switch 14, a switch control circuit (e.g., switch control circuit 18 in FIG. 1) asserts a low logic voltage on switch enable lead 68. In response to receiving the low logic voltage, gate control circuit 32 outputs a signal via conductor 72 that causes gate driver 34 to cease to generate a voltage that is sufficient to turn on pass transistor 30. Initially, pass transistor 30 may remain turned on until a discharge path is formed though transistors 38 and 40, and the gate electrode of pass transistor 30 is sufficiently discharged to turn off pass transistor 30.

Inverter 46 is powered by one or both of input voltage lead 62 and bias voltage lead 66. In response to receiving the low logic voltage carried by switch enable lead 68, inverter 62 outputs a high logic voltage to the gate electrode of transistor 38, which turns transistor 38 on. Consequently, a current conduction path (e.g., a discharge path) is formed between the gate electrode of pass transistor 30 and ground lead 70. Initially, the voltages supplied by input voltage lead 62 and bias voltage lead 66 may be less than the voltage at the gate electrode of pass transistor 30 when load switch 34 is first disabled. Thus, transistor 40 may initially operate in the saturation mode and charge conductor 82 to a voltage that is less than the voltage at the gate of transistor 40, but still sufficient to keep transistor 42 turned on.

As the gate electrode of pass transistor 30 continues to discharge, the gate voltage of pass transistor 30 may become less than the voltage at the gate of transistor 40 by a sufficient amount to cause transistor 40 to transition from operating in the saturation mode to operating in the triode mode. In response to operating in the triode mode, transistor 40 may charge conductor 82 to a voltage level that is approximately equal to the voltage at the gate electrode of pass transistor 30, thereby effectively coupling the source electrode of transistor 40 to the gate electrode of pass transistor 30.

During the discharge of the gate electrode of pass transistor 30, pass transistor 30 turns off, thereby disconnecting input voltage lead 62 from output voltage lead 64. As the gate electrode of pass transistor 30 continues to discharge further, the gate voltage of pass transistor 30 may become less than a voltage required to keep transistor 42 turned on, thereby causing transistor 42 to turn off. In response to transistor 42 turning off, the drain of transistor 42 may charge up to a voltage approximately equal to the voltage of one or both of bias voltage lead 66 and input voltage lead 62. This voltage is sufficient to turn on transistor 44, thereby forming a current conduction path (e.g., a discharge path) between output voltage lead 64 and ground lead 70. The charge stored on output voltage lead 64 is discharged through the current conduction path formed by ground lead 70.

As discussed above, the activation of the output discharge circuit (e.g., the turning on of transistor 44) depends on the inverter formed by transistor 42 and resistor 48 raising the voltage at the gate of transistor 44 to a sufficiently high voltage to turn on transistor 44. If sufficient power is not provided to the power rail (e.g., conductor 84) of the inverter formed by transistor 42 and resistor 48, the inverter may not be able to produce a sufficiently high voltage to keep transistor 44 turned on, thereby preventing the output of load switch 14 from being discharged.

According to this disclosure, load switch 14 may include capacitor 50 coupled between a power rail (e.g., conductor 84) of the output discharge circuit and ground lead 70, and diodes 54, 56 coupled between power inputs of the output discharge circuit and the power rail (e.g., conductor 84). The output discharge circuit may charge capacitor 50 via current paths formed by diodes 54, 56 when a power supply is supplying power to load switch 14 (e.g., supplying power via input voltage lead 62 and/or bias voltage lead 66). When the power supply ceases to supply power to input voltage lead 62 and bias voltage lead 66, diodes 54, 56 may prevent capacitor 50 from discharging through the current paths, and the stored charge on capacitor 50 may be used to power the output discharge switch for a period of time after the power supply ceases to supply power. In this way, load switch 14 may continue to discharge the output (VOUT) of load switch 14 even when power is no longer being supplied to load switch 14.

The output discharge circuit in FIG. 2 may be controlled at least partially based on the gate voltage of pass transistor 30. This may allow the activation of output discharge circuit to be delayed until pass transistor 30 is turned off. When coupling the gate voltage of pass transistor 30 to the control circuitry for the output discharge circuit, a gate voltage coupling circuit (e.g., transistor 40) may be used to prevent high voltages on the gate of the pass transistor from damaging the control circuit. Transistor 40 may operate based on a reference voltage that is supplied by one or both of input voltage lead 62 and bias voltage lead 66. If the reference voltage is not supplied to transistor 40, transistor 40 may cause the output discharge circuit to activate, even if pass transistor 30 is still turned on, which may cause undesirable levels of inrush current to occur.

According this disclosure, capacitor 52 may be coupled between a control electrode of transistor 40 and ground lead 70, and diodes 58, 60 may be coupled between reference voltage inputs (e.g., input voltage lead 62 and bias voltage lead 66) and the control electrode of transistor 40. The control circuit may charge capacitor 52 via current paths formed by diodes 58, 60 when a power supply is supplying power to load switch 14 (e.g., supplying power via input voltage lead 62 and/or bias voltage lead 66). When the power supply ceases to supply power to input voltage lead 62 and bias voltage lead 66, diodes 58, 60 may prevent capacitor 52 from discharging through the current paths, and the stored charge on capacitor 52 may be used to provide a reference voltage to transistor 40 for a period of time after the power supply ceases to supply power, thereby allowing transistor 40 to continue to operate even after power is no longer supplied to the reference voltage inputs. In this way, the activation of an output discharge circuit may be delayed until after pass transistor 30 turns off even when power is no longer being supplied to load switch 14.

In additional examples, the control circuitry for the output discharge circuit of load switch 14 may also include a pass transistor gate discharge circuit (e.g., transistor 38) that forms a discharge path for the gate voltage of pass transistor 30 when load switch 14 is turned off. Such a circuit may include a buffer (e.g., inverter 46) that is controlled by an enable input of load switch 14, and powered by one or both of bias voltage lead 66 and input voltage lead 62 of load switch 14. If power ceases to be supplied to inverter 46, then inverter 46 may output a low voltage, which may prevent the gate discharge circuit from forming a discharge path for the gate of pass transistor 30, which may prevent or delay pass transistor 30 from turning off when disabled.

According to this disclosure, capacitor 52 may be coupled between a power rail (e.g., conductor 78) of inverter 46 and ground lead 70, and diodes 58, 60 may be coupled between a power input of load switch 14 and the power rail of inverter 46. Capacitor 52 and diodes 58, 60 may allow inverter 46 to continue to supply a high voltage to transistor 38 even after power has ceased to be supplied to load switch 14. In this way, the gate of pass transistor 30 may continue to be discharged even when power is no longer being supplied to load switch 14.

The example load switch 14 shown in FIG. 2 includes two diodes 54, 56 coupled to two power inputs, respectively, of the output discharge circuit. In other examples, more or less power inputs and diodes may be used. For example, diode 54 and bias voltage lead 66 may be removed leaving a single power input (e.g., input voltage lead 62) and a single diode (e.g., diode 56). As another example, input voltage lead 62 and diode 56 may be removed leaving a single power input (e.g., diode 54) and a single diode (e.g., bias voltage lead 66).

Similarly, more or less power inputs and diodes may be used for diodes 58, 60 coupled to the control circuit. For example, diode 58 and bias voltage lead 66 may be removed leaving a single power input (e.g., input voltage lead 62) and a single diode (e.g., diode 60). As another example, input voltage lead 62 and diode 60 may be removed leaving a single power input (e.g., diode 58) and a single diode (e.g., bias voltage lead 66).

Figure 3:
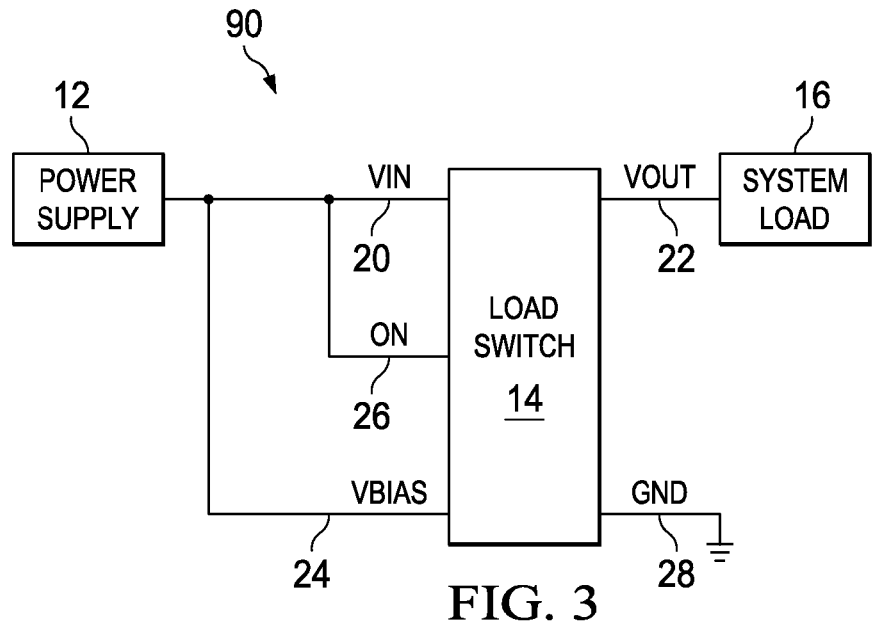
FIG. 3 is a block diagram showing another example system that includes a load switch according to this disclosure.

FIG. 3 is a block diagram showing another example system 90 that includes a load switch 14 according to this disclosure. System 90 is similar to system 10 shown in FIG. 1 except that: (1) switch control circuit 18 is omitted; and (2) lead 26 is coupled to power supply 12 via lead 20. A load switch user may couple or tie the enable pin (ON pin) to the input supply (VIN) so that when power supply 12 is turned off, load switch 14 may also turn off.

To disable load switch 14, power supply 12 may be turned off. Turning off power supply 12, however, may also turn of the power supply to input voltage lead 62 and bias voltage lead 66 shown in FIG. 2. The load switch 14 shown in FIG. 2, however, may still allow the switch to smoothly turn off, and the output discharge circuit to seamlessly discharge the output (VOUT) of load switch 14 even when power is no longer being supplied to the voltage input (VIN) and the bias voltage input (VBIAS). As such, the techniques of this disclosure become particularly useful in systems where designers may desire to couple together the enable pin (ON) of load switch 14 to one or both of the input voltage pin (VIN) and the bias voltage input pin (VBIAS).

Figure 4:
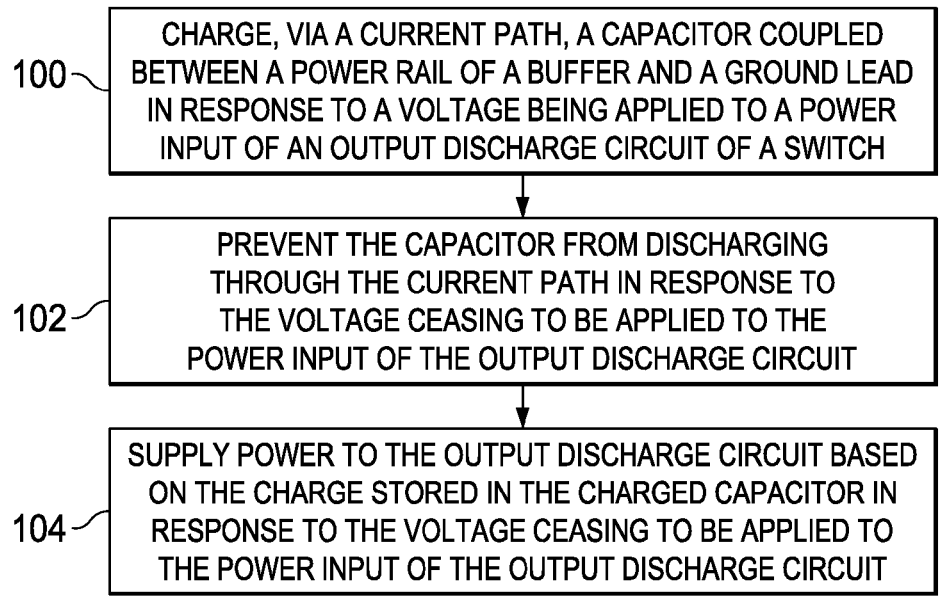
FIG. 4 is a flow diagram illustrating an example technique for controlling an output discharge circuit of a load switch according to this disclosure.

FIG. 4 is a flow diagram illustrating an example technique for controlling an output discharge circuit of a load switch according to this disclosure. Load switch 14 charges, via a current path, capacitor 50 coupled between a power rail of a buffer and a ground lead in response to a voltage being applied to a power input of an output discharge circuit of a switch (100). Load switch 14 prevents capacitor 50 from discharging through the current path in response to the voltage ceasing to be applied to the power input of the output discharge circuit (102). Load switch 14 supplies power to the output discharge circuit based on the charge stored in the charged capacitor in response to the voltage ceasing to be applied to the power input of the output discharge circuit (104).

This disclosure describes an integrated circuit (e.g., load switch 14) that includes an input voltage lead (62) an output voltage lead (64); a pass transistor (30) coupled between the input voltage lead and the output voltage lead; and an output discharge circuit (e.g., 42, 44, 48, 50, 54, 56). The output discharge circuit includes a power input (e.g., anode of one of diodes 54 and 56 (e.g., VIBAS and VIN)), a control input (e.g., gate electrode of transistor 42); a first transistor (44) coupled between the output voltage lead and a ground lead. The first transistor has a control electrode. The output discharge circuit further includes a diode (54 or 56) having an anode coupled to the power input; a capacitor (50) coupled between a cathode of the diode and the ground lead; a resistor (48) coupled between the cathode of the diode and the control electrode of the first transistor (44); and a second transistor (42) coupled between the control electrode of the first transistor (44) and the ground lead. The second transistor (42) has a control electrode coupled to the control input of the output discharge circuit.

In some examples, the integrated circuit further includes a switch enable lead (68) and a control circuit (e.g., 38, 40, 46, 52, 58, 60). The control circuit includes a power input (e.g., anode of one of diodes 58 and 60 (e.g., VIBAS and VIN)), and a third transistor (40) coupled between a gate electrode of the pass transistor and the control input (e.g., gate electrode of transistor 42) of the output discharge circuit. The third transistor has a control electrode. The control circuit further includes a fourth transistor (38) coupled between the control input (e.g., gate electrode of transistor 42) of the output discharge circuit and the ground lead; and a buffer (46) having an input coupled to the switch enable lead, an output coupled to a control electrode of the fourth transistor (38), and a power rail coupled to the control electrode of the third transistor (40). The control circuit further includes a second capacitor (52) coupled between the control electrode of the third transistor (40) and the ground lead; and a second diode (58 or 60) having an anode coupled to the power input of the control circuit, and a cathode coupled to the control electrode of the third transistor and to the power rail (e.g., conductor 78) of the buffer (46).

This disclosure describes an integrated circuit (e.g., load switch 14) that includes an input voltage lead (62); an output voltage lead (64); a pass transistor (30) coupled between the input voltage lead and the output voltage lead; and an output discharge circuit (e.g., 42, 44, 48, 50, 54, 56) coupled between the output voltage lead and a ground lead. The output discharge circuit includes a power input (e.g., anode of one of diodes 54 and 56 (e.g., VIBAS and VIN)); a diode (54 or 56) having an anode coupled to the power input; and a capacitor (50) coupled between a cathode of the diode and the ground lead.

In some examples, output discharge circuit further includes a control input (e.g., gate electrode of transistor 42); and a switch (44) coupled between the output voltage lead and the ground lead. The switch has a control electrode (e.g., gate of transistor 44). The output discharge circuit further includes a buffer (e.g., 42 and 48) having an input (e.g., gate electrode of transistor 42) coupled to the control input of the output discharge circuit, an output (e.g., drain electrode of transistor 42) coupled to the control electrode of the switch (44), and a power rail (84) coupled to the cathode of the diode (54 or 56).

In some examples, the buffer (e.g., 42 and 48) is an inverter. In further examples, the inverter is an n-type metal-oxide semiconductor (NMOS) inverter. In other examples, the inverter may be replaced with a non-inverting buffer.

In some examples, the integrated circuit further includes a control circuit (e.g., 38, 40, 46, 52, 58, 60) coupled between a gate electrode of the pass transistor (12) and the control input (e.g., gate electrode of transistor 42) of the output discharge circuit.

In further examples, the control circuit includes a reference voltage input e.g., (anode of one of diodes 58 and 60 (e.g., VIBAS and VIN)); a transistor (40) coupled between the gate electrode of the pass transistor (12) and the control input (e.g., gate electrode of transistor 42) of the output discharge circuit. The transistor (40) has a control electrode. The control circuit further includes a second capacitor (52) coupled between the control electrode and the ground lead; and a second diode (58 or 60) having an anode coupled to the reference voltage input, and a cathode coupled to the control electrode of the transistor (40).

In some examples, the reference voltage input (e.g., anode of diode 60) is coupled to the input voltage lead (62). In additional examples, the integrated circuit further includes a bias voltage lead (66); and a charge pump circuit (36) coupled to the bias voltage lead; a gate driver circuit (34) having a power input (74) coupled to the charge pump circuit, and an output (76) coupled to the gate of the pass transistor (12). The control circuit further includes a third diode (58) having an anode coupled to the bias voltage lead (66), and a cathode coupled to the control electrode of the transistor (40).

In some examples, the control circuit includes a gate electrode discharge circuit (38) coupled between the control input (e.g., gate electrode of transistor 42) of the output discharge circuit and the ground lead. In further examples, the integrated circuit further includes a switch enable lead (68), and the gate electrode discharge circuit includes a transistor (38) coupled between the control input of the output discharge circuit and the ground. In such examples, the control circuit further includes a power input (anode of one of diodes 58 and 60 (e.g., VIBAS and VIN)); a buffer (inverter 46) having an input coupled to the switch enable lead (68), an output coupled to a control electrode of the transistor (38), and a power rail (e.g., 78); a second capacitor (52) coupled between the power rail of the buffer and the ground lead; and a second diode (58 or 60) having an anode coupled to the power input of the control circuit, and a cathode coupled to the power rail of the buffer (46).

In some examples, the power input (e.g., anode of diode 60) of the control circuit is coupled to the input voltage lead (62). In further examples, the integrated circuit further includes a bias voltage lead (66); a charge pump circuit (36) coupled to the bias voltage lead; a gate driver circuit (34) having a power input (74) coupled to the charge pump circuit, and an output (76) coupled to a gate of the pass transistor; and a third diode (58) having an anode coupled to the bias voltage lead (66), and a cathode coupled to the power rail of the buffer (46).

In some examples, the output discharge circuit further includes a control input (e.g., gate electrode of transistor 42); a switch (44) coupled between the output voltage lead and the ground lead. The switch has a control electrode (e.g., gate electrode of transistor 44); a resistive component (e.g., 48) coupled between the cathode of the diode (54 or 56) and the control electrode of the switch (44); and a transistor (42) coupled between control electrode of the switch (44) and the ground lead. The transistor (42) has a control electrode (e.g., gate of transistor 42) coupled to the control input of the output discharge circuit.

In some examples, the power input (e.g. anode of diode 56) of the output discharge circuit is coupled to the input voltage lead (62). In further examples, the integrated circuit further includes a bias voltage lead (66); a charge pump circuit (36) coupled to the bias voltage lead; a gate driver circuit (34) having a power input (74) coupled to the charge pump circuit, and an output (76) coupled to a gate of the pass transistor (12). In such examples, the power input (e.g., anode of diode 54) of the output discharge circuit is coupled to the bias voltage lead (66).

In some examples, the output discharge circuit further includes a second power input (anode of one of diodes 54 and 56 (e.g., VIBAS and VIN)); a second diode (54 or 56) having an anode coupled to the second power input. A cathode of the second diode is coupled to the capacitor (50) and to the cathode of the first diode (54 or 56).

Load switches with quick output discharge circuits may not function properly when the part loses input power. In some applications, like solid state drives for example, if the output is not discharged properly, data corruption may occur if the downstream circuitry is not shut down properly.

In some examples, the techniques of this disclosure may use a large capacitor to make an internal power supply that allows the discharge buffer to have power if the power supply goes away. The techniques of this disclosure may allow an output discharge to continue to function even after an input power loss.

The techniques of this disclosure may allow load switch users to discharge the output of a load switch when relatively large capacitance loads (e.g., ~200 µF) are coupled to the output of the load switch even with a loss of power supply to the device.

When a load switch is disabled with power applied, the output may be discharged such that there are no issues with downstream circuitry. In some examples, a load switch user may couple or tie the enable pin (ON pin) to the input supply so that when power drops, the load switch may shut off.

In some examples, the output discharge circuit of load switch 14 may be configured to discharge a load capacitance (e.g., capacitance of system load 16) that is greater than or equal to 50 microfarads (g), and more particularly greater than or equal to 100 µF, and more particularly greater than or equal to 200 µF.

In some examples, the techniques of this disclosure may discharge a load capacitor tied to the VOUT pin when VIN supply goes away. In further examples, the techniques of this disclosure may allow the output capacitance to be discharged when the load switch is disabled, and with VBIAS (e.g., power supply to the integrated circuit (IC)) and VIN (e.g., voltage to pass) dropping out. In additional examples, the techniques of this disclosure may keep the output (VOUT) of the load switch pulled low (e.g., to ground) when VIN is available but no VBIAS present, which may serve as a safety function and/or to avoid data corruption.

In further examples, the techniques of this disclosure may provide some or all of the above-mentioned functionality with low quiescent current. The techniques of this disclosure may, in some examples, ensure that the pass Power FET (e.g., gate transistor 30) is fully off when either VBIAS or VIN is present before the output discharge circuit is engaged to prevent shoot through current. In some examples, a load switch may include a circuit to power the gate pull down of the Power FET on loss of either VIN or VBIAS. In further examples, a load switch may include a circuit to hold voltage for an inverter or buffer power supply in the event of VIN or VBIAS loss.

The techniques of this disclosure may allow an output discharge circuit to discharge a large capacitive load with input power disappearing suddenly. For example, with supply voltage loss, an output discharge circuit designed in accordance with this disclosure may be able to discharge a voltage on a 100 µF capacitor to near zero in less than 10 milliseconds (ms), and more particularly, less than approximately 2 ms.

In some examples, one or more of diodes 54, 56, 58, 60 may be implemented using parasitic diodes that are formed by p-n junctions included in one or more MOS transistors (e.g., NMOS transistors). In further examples, inverter 46 may be replaced by a common source transistor stage that is either actively loaded (e.g., loaded with a transistor) or passively loaded (e.g., with a resistor). In additional examples, transistor 42 and resistor 48 may form a passively-loaded common source stage.

The techniques and circuitry described in this disclosure may, in some examples, be implemented on any combination of one or more integrated circuits or other devices. Although illustrative examples have been shown and described by way of example, a wide range of alternative examples are possible within the scope of the foregoing disclosure.

What is claimed is:

1. An integrated circuit comprising:
an input voltage lead;
an output voltage lead;
a pass transistor coupled between the input voltage lead and the output voltage lead; and
an output discharge circuit including:
a power input;
a control input;
a first transistor coupled between the output voltage lead and a ground lead, the first transistor having a control electrode;
a diode having an anode coupled to the power input;
a capacitor coupled between a cathode of the diode and the ground lead;
a resistor coupled between the cathode of the diode and the control electrode of the first transistor; and
a second transistor coupled between the control electrode of the first transistor and the ground lead, the second transistor having a control electrode coupled to the control input of the output discharge circuit.

2. The integrated circuit of claim 1, wherein the capacitor is a first capacitor, the diode is a first diode, and the integrated circuit further comprises:
a switch enable lead; and
a control circuit including:
a power input;
a third transistor coupled between a gate electrode of the pass transistor and the control input of the output discharge circuit, the third transistor having a control electrode;
a fourth transistor coupled between the control input of the output discharge circuit and the ground lead;
a buffer having an input coupled to the switch enable lead, an output coupled to a control electrode of the fourth transistor, and a power rail coupled to the control electrode of the third transistor;
a second capacitor coupled between the control electrode of the third transistor and the ground lead; and
a second diode having an anode coupled to the power input of the control circuit, and a cathode coupled to the control electrode of the third transistor and to the power rail of the buffer.

3. An integrated circuit comprising:
an input voltage lead;
an output voltage lead;
a pass transistor coupled between the input voltage lead and the output voltage lead; and
an output discharge circuit coupled between the output voltage lead and a ground lead, the output discharge circuit including:
a power input;
a diode having an anode coupled to the power input;
a capacitor coupled between a cathode of the diode and the ground lead;
a control input;
a switch coupled between the output voltage lead and the ground lead, the switch having a control electrode; and
a buffer having an input coupled to the control input of the output discharge circuit, an output coupled to the control electrode of the switch, and a power rail coupled to the cathode of the diode.

4. The integrated circuit of claim 3, wherein the buffer is an inverter.

5. The integrated circuit of claim 4, wherein the inverter is an n-type metal-oxide semiconductor (NMOS) inverter.

6. The integrated circuit of claim 3, wherein the buffer is a non-inverting buffer.

7. The integrated circuit of claim 3, further comprising:
a control circuit coupled between a gate electrode of the pass transistor and the control input of the output discharge circuit.

8. The integrated circuit of claim 7, wherein the capacitor is a first capacitor, the diode is a first diode, and the control circuit includes:
a reference voltage input;
a transistor coupled between the gate electrode of the pass transistor and the control input of the output discharge circuit, the transistor having a control electrode;
a second capacitor coupled between the control electrode of the transistor and the ground lead; and
a second diode having an anode coupled to the reference voltage input, and a cathode coupled to the control electrode of the transistor.

9. The integrated circuit of claim 8, wherein the reference voltage input is coupled to the input voltage lead.

10. The integrated circuit of claim 9, further comprising:
a bias voltage lead;
a charge pump circuit coupled to the bias voltage lead; and
a gate driver circuit having a power input coupled to the charge pump circuit, and an output coupled to the gate of the pass transistor,
wherein the control circuit further includes a third diode having an anode coupled to the bias voltage lead, and a cathode coupled to the control electrode of the transistor.

11. The integrated circuit of claim 7, wherein the control circuit includes:
a gate electrode discharge circuit coupled between the control input of the output discharge circuit and the ground lead.

12. The integrated circuit of claim 11, wherein the capacitor is a first capacitor, the diode is a first diode, the integrated circuit further comprises a switch enable lead, the gate electrode discharge circuit includes a transistor coupled between the control input of the output discharge circuit and the ground lead, and the control circuit further includes:
a power input;
a buffer having an input coupled to the switch enable lead, an output coupled to a control electrode of the transistor, and a power rail;
a second capacitor coupled between the power rail of the buffer and the ground lead; and
a second diode having an anode coupled to the power input of the control circuit, and a cathode coupled to the power rail of the buffer.

13. The integrated circuit of claim 12, wherein the power input of the control circuit is coupled to the input voltage lead.

14. The integrated circuit of claim 13, further comprising:
a bias voltage lead;
a charge pump circuit coupled to the bias voltage lead; and
a gate driver circuit having a power input coupled to the charge pump circuit, and an output coupled to a gate of the pass transistor, wherein the control circuit further includes a third diode having an anode coupled to the bias voltage lead, and a cathode coupled to the power rail of the buffer.

15. The integrated circuit of claim 3, wherein the power input of the output discharge circuit is coupled to the input voltage lead.

16. An integrated circuit comprising:
an input voltage lead;
an output voltage lead;
a pass transistor coupled between the input voltage lead and the output voltage lead; and
an output discharge circuit coupled between the output voltage lead and a ground lead, the output discharge circuit including:
a power input;
a diode having an anode coupled to the power input;
a capacitor coupled between a cathode of the diode and the ground lead;
a control input;
a switch coupled between the output voltage lead and the ground lead, the switch having a control electrode;
a resistive component coupled between the cathode of the diode and the control electrode of the switch; and
a transistor coupled between control electrode of the switch and the ground lead, the transistor having a control electrode coupled to the control input of the output discharge circuit.

17. An integrated circuit comprising:
an input voltage lead;
an output voltage lead;
a pass transistor coupled between the input voltage lead and the output voltage lead; and
an output discharge circuit coupled between the output voltage lead and a ground lead, the output discharge circuit including:
a power input;
a diode having an anode coupled to the power input;
a capacitor coupled between a cathode of the diode and the ground lead;
a bias voltage lead;
a charge pump circuit coupled to the bias voltage lead; and
a gate driver circuit having a power input coupled to the charge pump circuit, and an output coupled to a gate of the pass transistor,
wherein the power input of the output discharge circuit is coupled to the bias voltage lead.

18. The integrated circuit of claim 17, wherein the power input of the output discharge circuit is a first power input, the diode is a first diode, and the output discharge circuit further includes:
a second power input; and
a second diode having an anode coupled to the second power input,
wherein a cathode of the second diode is coupled to the capacitor and to the cathode of the first diode.

19. A method comprising:
charging, via a current path, a capacitor coupled between a power rail of a buffer and a ground lead in response to a voltage being applied to a power input of an output discharge circuit of a switch;
preventing the capacitor from discharging through the current path in response to the voltage ceasing to be applied to the power input of the output discharge circuit; and
supplying power to the output discharge circuit based on the charge stored in the charged capacitor in response to the voltage ceasing to be applied to the power input of the output discharge circuit.

* * * * *